(12) United States Patent
Hu et al.

(10) Patent No.: US 11,322,646 B2
(45) Date of Patent: May 3, 2022

(54) LIGHT-EMITTING DIODE PACKAGE AND ELECTRONIC DEVICE

(71) Applicant: InnoLux Corporation, Miao-Li County (TW)

(72) Inventors: Shun-Yuan Hu, Miao-Li County (TW); Chin-Lung Ting, Miao-Li County (TW); Ker-Yih Kao, Miao-Li County (TW); Li-Wei Mao, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 69 days.

(21) Appl. No.: 16/726,285

(22) Filed: Dec. 24, 2019

(65) Prior Publication Data

US 2020/0235261 A1 Jul. 23, 2020

Related U.S. Application Data

(60) Provisional application No. 62/793,952, filed on Jan. 18, 2019.

(30) Foreign Application Priority Data

Sep. 6, 2019 (CN) .......................... 201910843568.2

(51) Int. Cl.
  *H01L 33/06* (2010.01)
  *H01L 33/44* (2010.01)
  *H01L 33/62* (2010.01)
(52) U.S. Cl.
  CPC .............. *H01L 33/06* (2013.01); *H01L 33/44* (2013.01); *H01L 33/62* (2013.01); *H01L 2933/005* (2013.01); *H01L 2933/0066* (2013.01)

(58) Field of Classification Search
  CPC ......... H01L 33/06; H01L 33/44; H01L 33/62; H01L 2933/005; H01L 2933/0066;
  (Continued)

(56) References Cited

U.S. PATENT DOCUMENTS 10,797,027 B2 * 10/2020 Takeya ................ H01L 21/6835
2009/0078955 A1 * 3/2009 Fan ......................... H01L 27/15
                                                              438/46

(Continued)

FOREIGN PATENT DOCUMENTS

CN          103199170 A          7/2013

OTHER PUBLICATIONS

Chinese language office action dated Jan. 15, 2021, issued in application No. CN 201910843568.2.

*Primary Examiner* — Nictor A Mandala
(74) *Attorney, Agent, or Firm* — McClure, Qualey & Rodack, LLP

(57) ABSTRACT

Some embodiments of the present disclosure provide a light-emitting diode package. The light-emitting diode package includes a transparent substrate. The light-emitting diode package also includes a first light-emitting diode which is disposed on the transparent substrate and has a first multiple quantum well structure. The light-emitting diode package further includes a second light-emitting diode which is disposed on the transparent substrate and has a second multiple quantum well structure. The first multiple quantum well structure and the second multiple quantum well structure are disposed to emit lights with different wavelengths.

18 Claims, 10 Drawing Sheets

(58) Field of Classification Search
CPC . H01L 33/54; H01L 2933/0025; H01L 33/56;
H01L 25/0753
See application file for complete search history.

(56) References Cited

U.S. PATENT DOCUMENTS

| | | | | |
|---|---|---|---|---|
| 2015/0333241 | A1* | 11/2015 | Chen | H01L 33/644 |
| | | | | 257/93 |
| 2016/0005941 | A1* | 1/2016 | Tsai | H01L 33/62 |
| | | | | 257/98 |
| 2017/0250329 | A1* | 8/2017 | Takeya | H01L 27/124 |
| 2017/0294424 | A1* | 10/2017 | Jeong | H01L 25/167 |
| 2018/0269352 | A1* | 9/2018 | Tian | H01L 25/0753 |
| 2019/0019839 | A1* | 1/2019 | Tian | H01L 25/167 |
| 2019/0044023 | A1* | 2/2019 | Cheng | H01L 33/0093 |
| 2019/0109262 | A1* | 4/2019 | Danesh | H01L 33/0095 |
| 2019/0206927 | A1* | 7/2019 | Lee | H01L 27/153 |
| 2019/0229097 | A1* | 7/2019 | Takeya | H01L 21/6835 |
| 2019/0386173 | A1* | 12/2019 | Chen | H01L 33/12 |
| 2020/0058825 | A1* | 2/2020 | Jang | H01L 33/62 |
| 2020/0203419 | A1* | 6/2020 | Andrews | H01L 33/007 |
| 2020/0212262 | A1* | 7/2020 | Jang | H01L 27/15 |
| 2020/0279979 | A1* | 9/2020 | Lee | H01L 27/156 |
| 2020/0321234 | A1* | 10/2020 | Choi | H01L 25/16 |
| 2020/0411492 | A1* | 12/2020 | Ju | H01L 33/44 |
| 2021/0036187 | A1* | 2/2021 | Lee | H01L 33/0093 |
| 2021/0057607 | A1* | 2/2021 | Lin | H01L 33/145 |
| 2021/0313303 | A1* | 10/2021 | Takeya | H01L 21/6835 |

\* cited by examiner

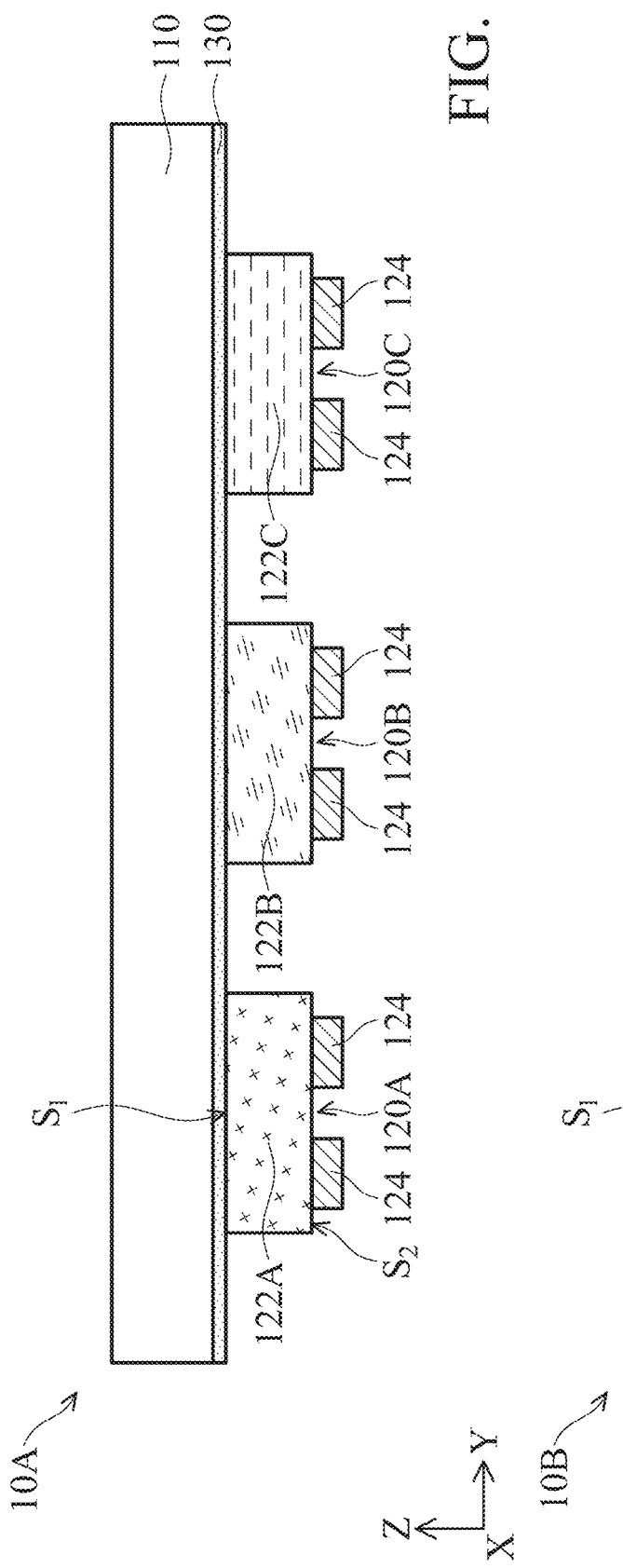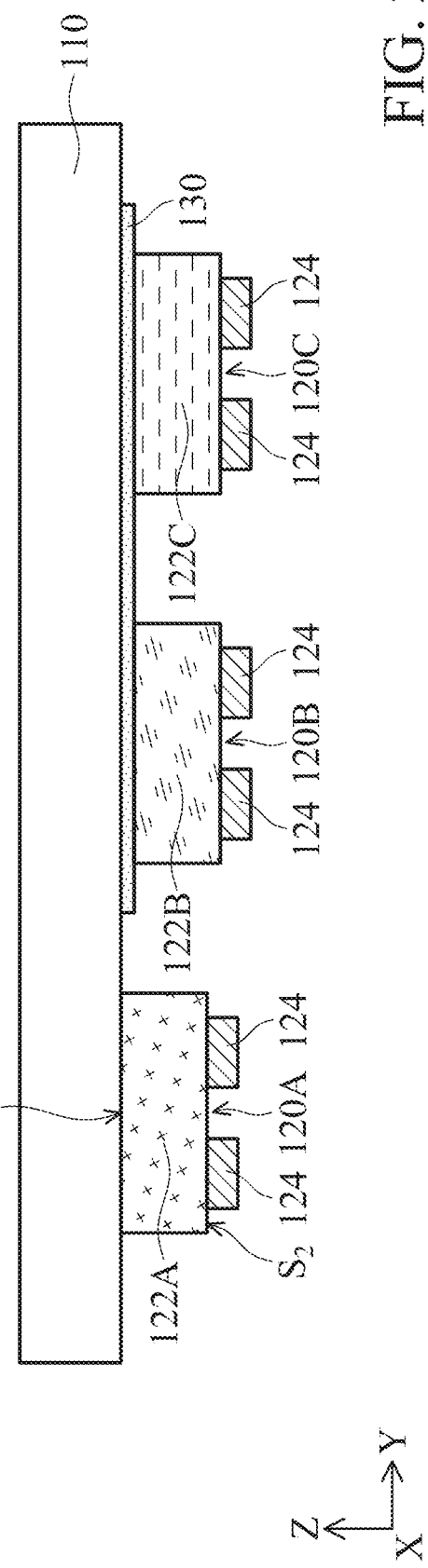

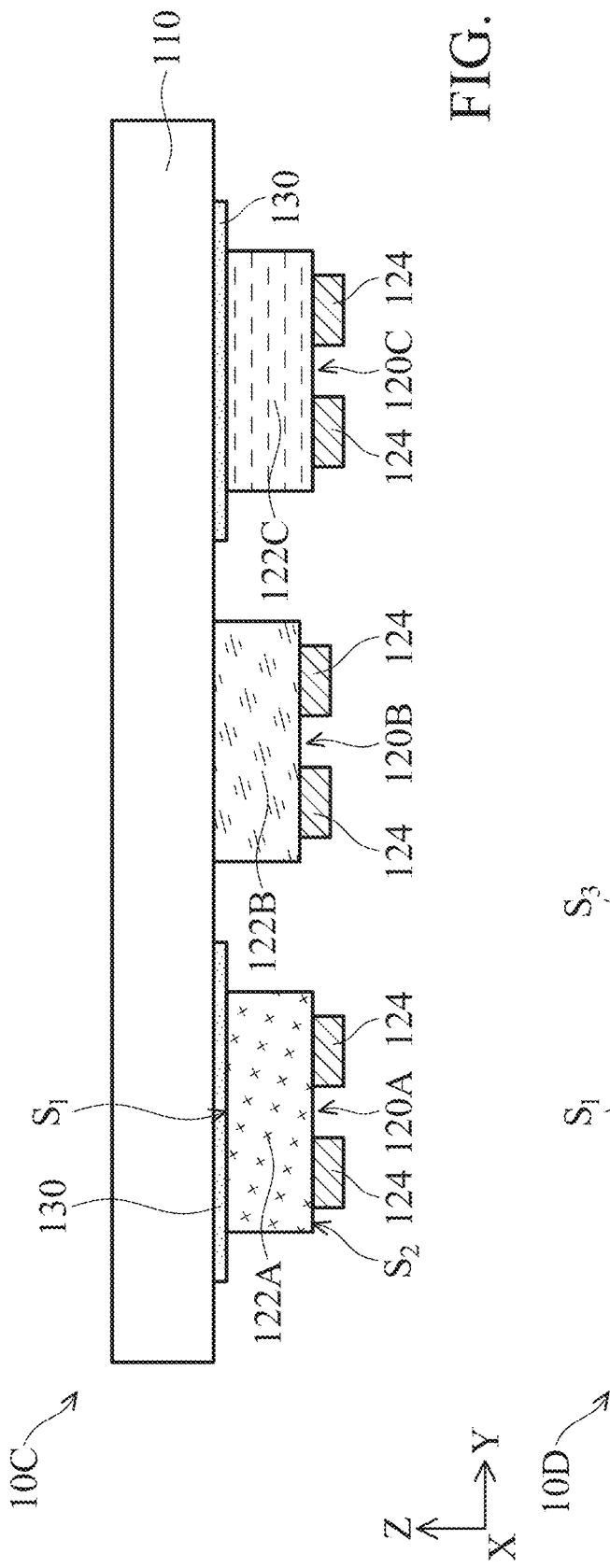
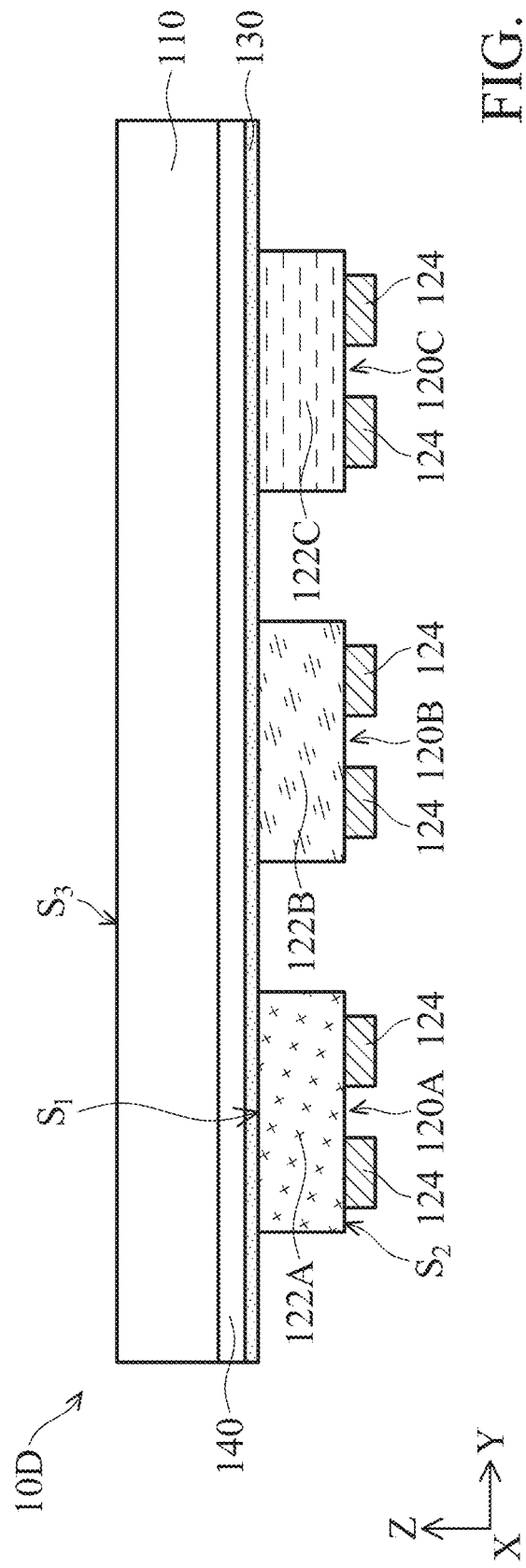

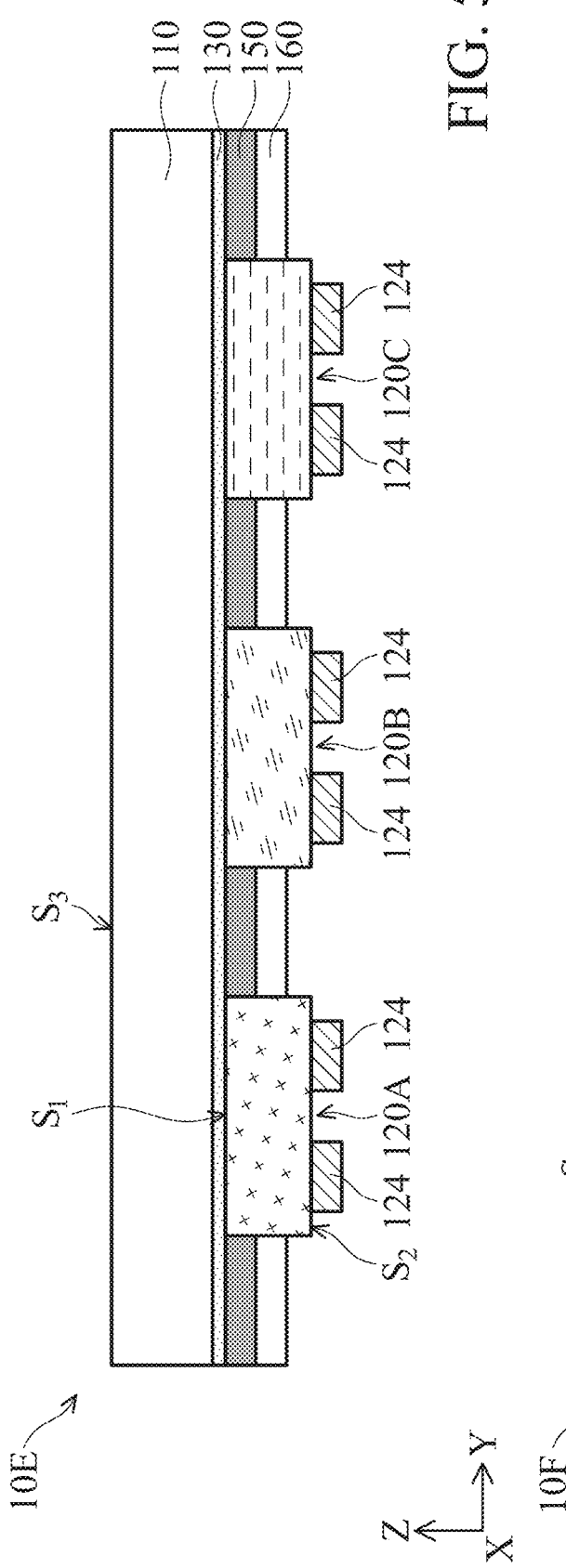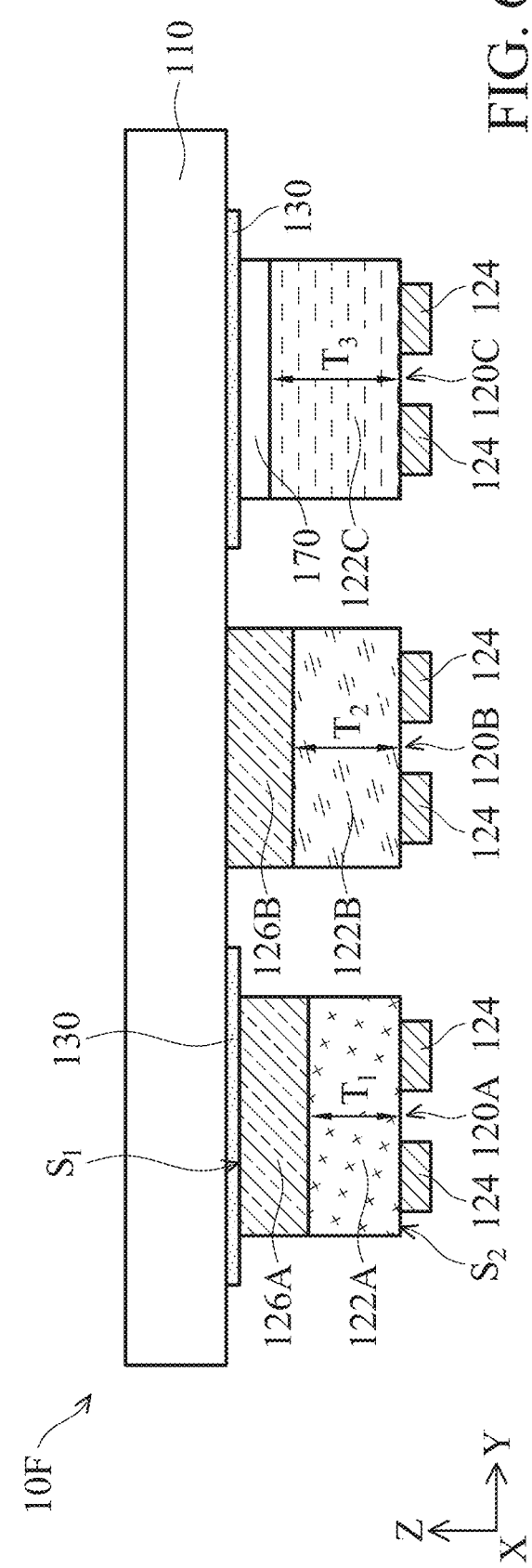

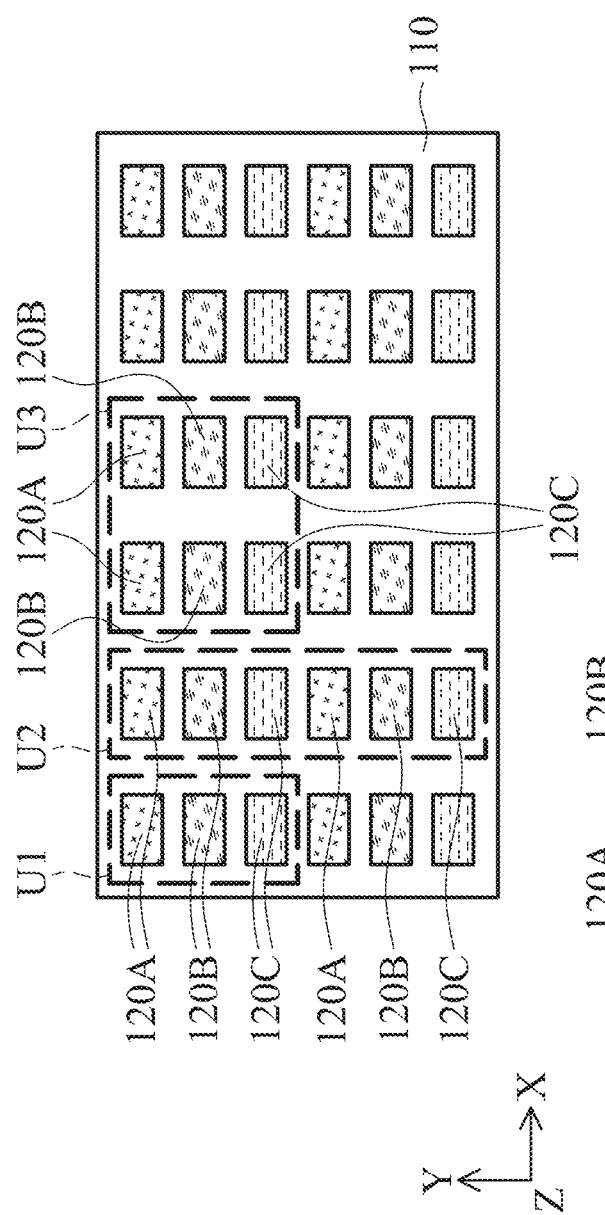

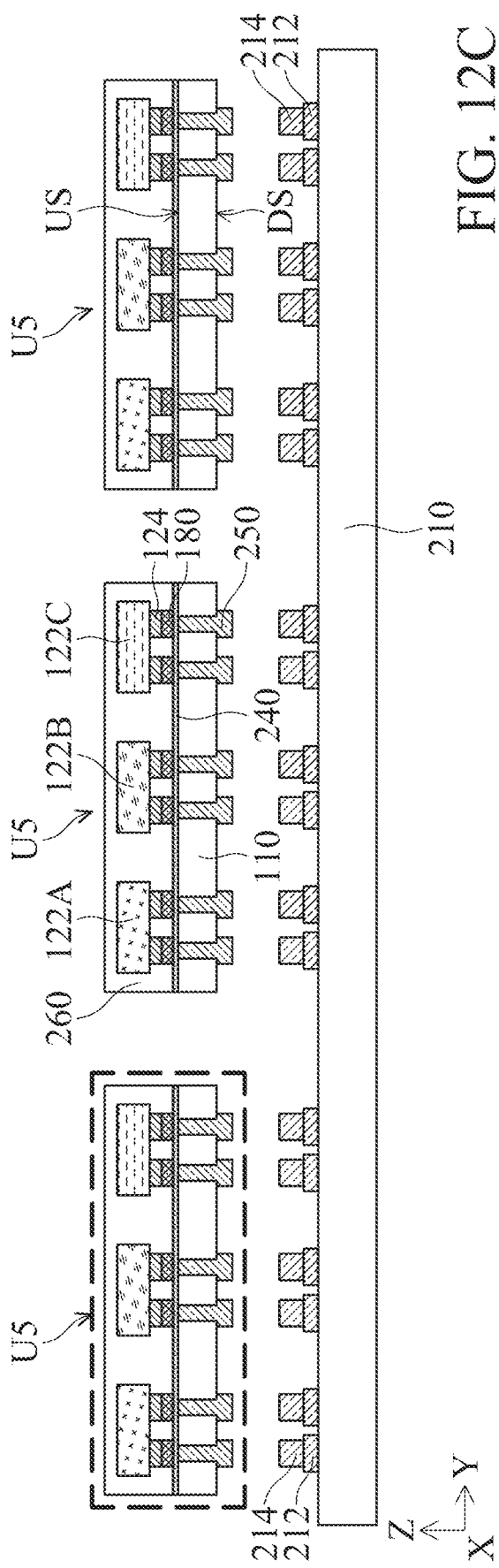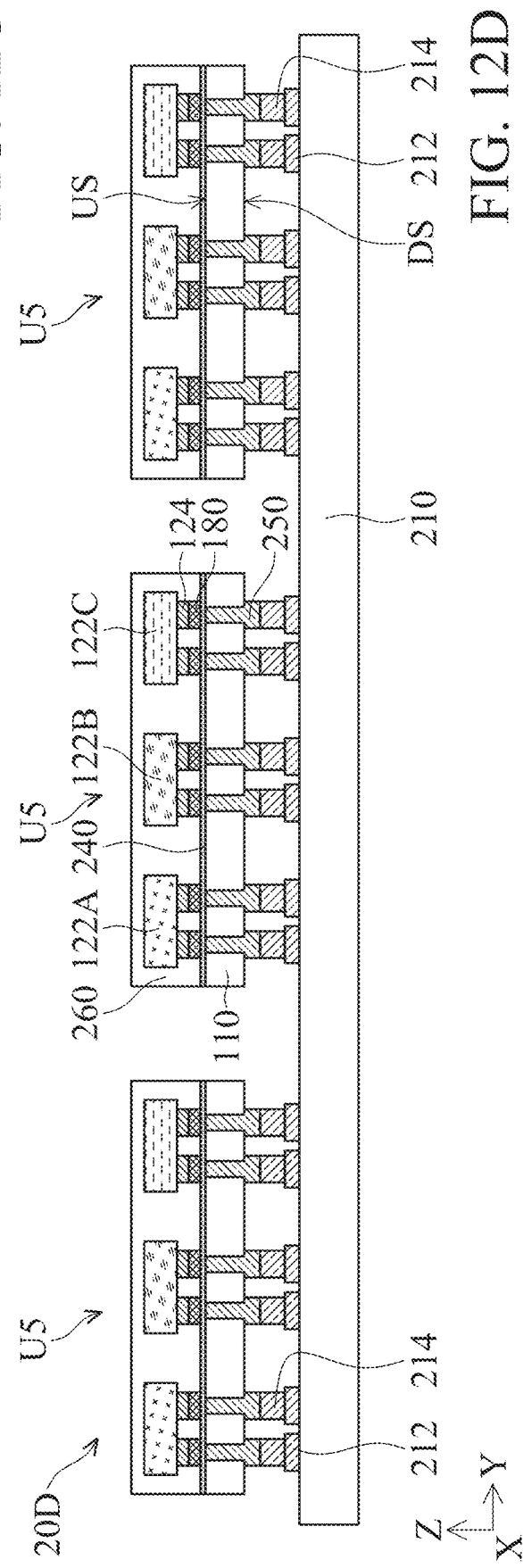

LIGHT-EMITTING DIODE PACKAGE AND ELECTRONIC DEVICE

CROSS REFERENCE TO RELATED APPLICATIONS

This application claims the benefit of U.S. Provisional Application No. 62/793,952, filed on Jan. 18, 2019, and also claims the benefit of China Patent Application No. 201910843568.2, filed on Sep. 6, 2019, the entirety of which are incorporated by reference herein.

BACKGROUND OF THE INVENTION

Field of the Invention

The present disclosure relates to an electronic device having a light-emitting diode package, and it particularly relates to a light-emitting diode package having a transparent substrate and an electronic device using the same.

Description of the Related Art

Light-emitting diodes have been widely used and are moving toward mass production or getting thinner. Therefore, how to improve the yield or thinning of the light-emitting diode package has become an important project.

BRIEF SUMMARY OF THE INVENTION

Some embodiments of the present disclosure provide a light-emitting diode package. The light-emitting diode package includes a transparent substrate. The light-emitting diode package also includes a first light-emitting diode which is disposed on the transparent substrate and has a first multiple quantum well structure. The light-emitting diode package further includes a second light-emitting diode which is disposed on the transparent substrate and has a second multiple quantum well structure. The first multiple quantum well structure and the second multiple quantum well structure are configured to emit lights with different wavelengths.

Some embodiments of the present disclosure provide an electronic device. The electronic device includes a circuit substrate. The electronic device also includes a light-emitting diode package disposed on the circuit substrate. The light-emitting diode package includes a transparent substrate. The light-emitting diode package also includes a first light-emitting diode which is disposed on the transparent substrate and has a first multiple quantum well structure. The light-emitting diode package further includes a second light-emitting diode which is disposed on the transparent substrate and has a second multiple quantum well structure. The first multiple quantum well structure and the second multiple quantum well structure are configured to emit lights with different wavelengths.

BRIEF DESCRIPTION OF THE DRAWINGS

The present invention can be more fully understood by reading the subsequent detailed description and examples with references made to the accompanying drawings, wherein:

FIG. 1 illustrates a cross-sectional view of a light-emitting diode package in accordance with some embodiments of the present disclosure.

FIG. 2 illustrates a cross-sectional view of a light-emitting diode package in accordance with some embodiments of the present disclosure.

FIG. 3 illustrates a cross-sectional view of a light-emitting diode package in accordance with some embodiments of the present disclosure.

FIG. 4 illustrates a cross-sectional view of a light-emitting diode package in accordance with some embodiments of the present disclosure.

FIG. 5 illustrates a cross-sectional view of a light-emitting diode package in accordance with some embodiments of the present disclosure.

FIG. 6 illustrates a cross-sectional view of a light-emitting diode package in accordance with some embodiments of the present disclosure.

FIG. 7 illustrates a top view of a light-emitting unit in accordance with some embodiments of the present disclosure.

FIG. 8 illustrates a top view of a light-emitting unit in accordance with some embodiments of the present disclosure.

FIGS. 12A-12D illustrate cross-sectional views of manufacturing an electronic device at various stages in accordance with some embodiments of the present disclosure.

DETAILED DESCRIPTION OF THE INVENTION

Figure 9:
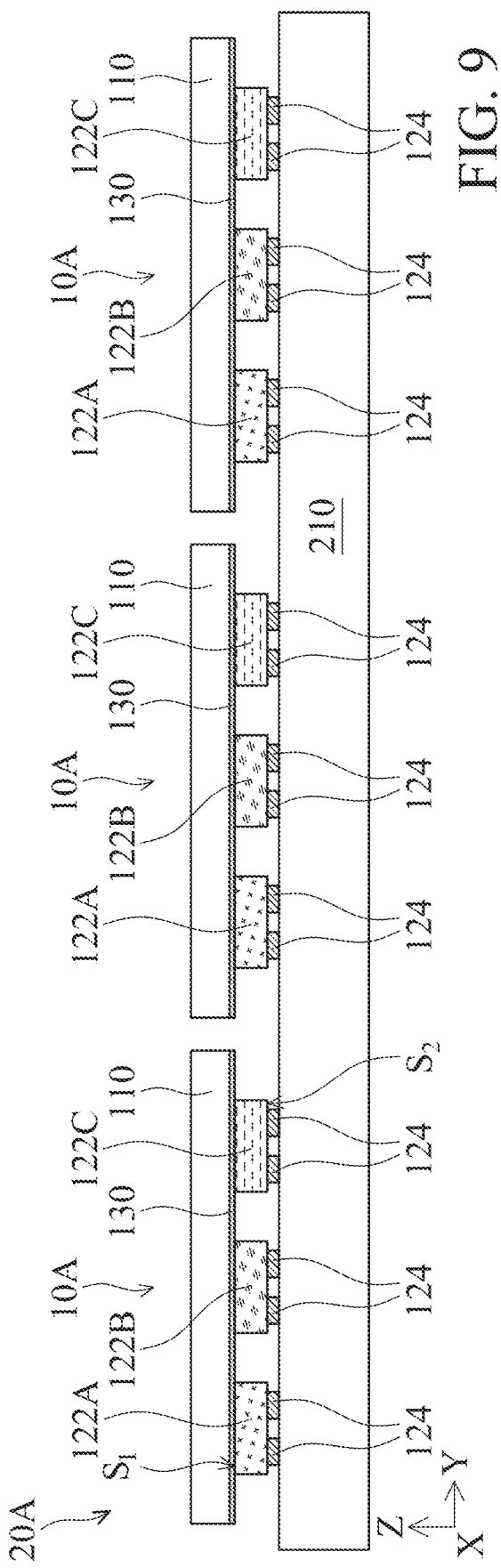
FIG. 9 illustrates a cross-sectional view of an electronic device in accordance with some embodiments of the present disclosure.

Hereinafter, a light-emitting diode package and a method of manufacturing the same of some embodiments of the present disclosure will be described in detail. It should be understood that different embodiments are provided below to implement the different aspects of the present disclosure. The particular elements and configurations described below are merely exemplary but not limiting. In addition, in the various embodiments, repeated reference numerals or signs may be used only to describe some embodiments simply and clearly, and do not represent any connection between the various embodiments and/or structures discussed. Furthermore, when a first layer is disposed on or located on a second layer, the situation where the first layer is directly in contact with the second layer is included. Alternatively, it is also possible to have one or more layers of other materials interposed, in which case there may be no direct contact between the first layer and the second layer.

Herein, the terms "about", "around" and "substantially" typically mean +/−20% of the stated value or range, typically +/−10% of the stated value or range, typically +/−5% of the stated value or range, typically +/−3% of the stated value or range, typically +/−2% of the stated value or range, typically +/−1% of the stated value or range, and typically +/−0.5% of the stated value or range. The stated value of the present disclosure is an approximate value. Namely, the meaning of "about", "around" and "substantially" may be implied if there is no specific description of "about", "around" and "substantially".

It should be understood that although the terms "first", "second", "third" etc. may be used herein to describe various elements, components, regions, layers, and/or portions, these elements, components, regions, layers, and/or portions should not be limited by these terms. These terms are only used to distinguish one element, component, region, layer, and/or portion or section from another region, layer or section. Thus, a first element, component, region, layer, or portion discussed below could be termed a second element, component, region, layer, or portion without departing from the teachings of the present disclosure.

Unless defined otherwise, all the terms used herein (including technical and scientific terms) have the same meaning as commonly understood by one of ordinary skill in the art to which this disclosure belongs. It should be appreciated that, in each case, the term, which is defined in a commonly used dictionary, should be interpreted as having a meaning that conforms to the related skills and the background or the context of the present disclosure, and should not be interpreted in an idealized or overly formal manner unless so defined in the embodiments of the present disclosure.

Some embodiments of the present disclosure can be understood in connection with the accompanying drawings, which are to be considered part of the entire written description. It should be understood that the drawings of the embodiments of the present disclosure are not drawn to scale. The shapes and thicknesses of elements (or layers) of the embodiments may be exaggerated in the drawings to clearly show the features.

In some embodiments of the present disclosure, relative terms such as "lower," "upper," "horizontal," "vertical", "below", "above", "top" and "bottom" should be construed to refer to the orientation as described in the paragraph or as shown in the drawing under discussion. These relative terms are only for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

It should be noted that the term "substrate" or "panel" hereinafter may include elements formed on the substrate (such as transistor elements or circuits) and the layers overlaying the substrate, but in order to simplify the drawings here, a flat substrate is shown.

Refer to FIG. 1, which illustrates a cross-sectional view of a light emitting diode package 10A in accordance with some embodiments of the present disclosure. The light-emitting diode packages shown in FIG. 1 and other embodiments below omits some elements for simplicity, additional elements may be added according to needs, and elements as described in the following embodiments may be optionally replaced or omitted.

In some embodiments, as shown in FIG. 1, a light-emitting diode package 10A may include a transparent substrate 110. The transparent substrate 110 has, for example, a high transmittance at some wavelengths of light (for example, wavelengths of visible light), and the transmittance of light is, for example, greater than 80% (or 90%), but not limited thereto. In some embodiments, the transparent substrate 110 may include glass, ceramic, plastic, polyimide (PI), sapphire, other suitable substrates, or combinations thereof, but is not limited thereto. In some embodiments, the transparent substrate 110 has, for example, a high transmittance for infrared light, ultraviolet light, and/or other suitable wavelengths of light, and the transmittance is, for example, greater than 80% (or 90%), but not limited thereto.

In some embodiments (such as FIG. 1), the light-emitting diode package 10A may include a plurality of light-emitting diodes, such as a light-emitting diode 120A, a light-emitting diode 120B, and a light-emitting diode 120C, but is not limited thereto. In some embodiments, the light-emitting diode 120A, the light-emitting diode 120B, and the light-emitting diode 120C may, for example, emit lights of different colors (or wavelengths) but are not limited thereto. For example, the light-emitting diode 120A can emit blue light, the light-emitting diode 120B can emit green light, and the light-emitting diode 120C can emit red light, but are not limited thereto. The light-emitting diodes can emit lights of other suitable colors (or wavelengths) according to needs. The light-emitting diodes may include, for example, an organic light-emitting diode (OLED), a light-emitting diode (LED) including, for example, a miniature light-emitting diode (mini-LED or micro-LED), or a quantum dot LED (for example, QLED, QDLED), quantum dot (QD), fluorescence, phosphor, another suitable material or a combination thereof, but are not limited thereto. In other embodiments (not shown), the light-emitting diode package 10A may include a plurality of light-emitting diodes. The plurality of light-emitting diodes may, for example, emit lights of the same color (or wavelength) (e.g., blue light or UV light, but not limited thereto, and the plurality of light-emitting diodes may be respectively configured with a light conversion layer (not shown) according to needs, and the light conversion layer may be used to convert the light emitted by the light-emitting diode to a light of a desired color, but is not limited thereto. The light conversion layer may include fluorescence, phosphor, Quantum Dot (QD), color filter, another suitable material or a combination thereof, but is not limited thereto.

In some embodiments (such as FIG. 1), the light-emitting diode 120A, the light-emitting diode 120B and the light-emitting diode 120C may include, for example, a multiple quantum well structure 122A, a multiple quantum well structure 122B and a multiple quantum well structure 122C, respectively. In some embodiments, the multiple quantum well structure 122A, the multiple quantum well structure 122B, and the multiple quantum well structure 122C may respectively include at least one light-emitting layer and at least two semiconductor layers (not shown), and the two semiconductor layers are, for example, respectively disposed on both sides of the light-emitting layer, but are not limited thereto. In some embodiments, the light-emitting layer may include a homojunction, a heterojunction, a single-quantum well (SQW), other suitable structures, or a combination thereof. In some embodiments, the semiconductors may include GaN, InN, AlN, $In_xGa_{(1-x)}N$, $Al_xIn_{(1-x)}N$, $Al_xIn_yGa_{(1-x-y)}N$, another suitable material or a combination thereof, but are not limited thereto.

In some embodiments, the multiple quantum well structure 122A, the multiple quantum well structure 122B and the multiple quantum well structure 122C may include a single layer or a composite layer structure. The disposition or formation methods of the multiple quantum well structure 122A, the multiple quantum well structure 122B and the multiple quantum well structure 122C may include metal organic chemical vapor deposition (MOCVD) method, molecular beam epitaxy (MBE) method, hydride vapor epitaxy (HVPE) method, liquid phase epitaxy (LPE) method, other suitable methods or a combination of thereof, but are not limited thereto.

In addition, the light-emitting diode 120A, the light-emitting diode 120B, and the light-emitting diode 120C may include, for example, conductive pads 124 and the conductive pads 124 of different light-emitting diodes are respectively disposed, for example, on the surfaces $S_2$ of the corresponding multiple quantum well structure 122A, the multiple quantum well structure 122B and the multiple quantum well structure 122C. The conductive pads 124 are used, for example, to electrically connect the light-emitting diode 120A, the light-emitting diode 120B and/or the light-emitting diode 120C to the conductive pads (not shown) on the circuit substrate 210 (see the subsequent FIG. 11E), but are not limited thereto. In some embodiments, the conductive pads 124 may include a metal material and/or a transparent conductive material. The metal material may include, for example, copper (Cu), nickel (Ni), gold (Au), titanium (Ti), aluminum (Al), molybdenum (Mo), chromium (Cr), palladium (Pt), silver (Ag), aluminum (Al), tungsten (W), other metal materials, an alloy thereof or a combination thereof, but are not limited thereto.

In some embodiments, the light-emitting diode package 10A may include an adhesive layer 130. The adhesive layer 130 is, for example, disposed between the light-emitting diode 120A, the light-emitting diode 120B, and/or the light-emitting diode 120C and the transparent substrate 110. The adhesive layer 130 may, for example, stick the light-emitting diode 120A, the light-emitting diode 120B and/or the light emitting diode 120C to the transparent substrate 110. In some embodiments, the adhesive layer 130 may include a transparent material such as an optical clear adhesive (OCA), an optical clear resin (OCR), a moisture curable adhesive, a photo-curable adhesive, another suitable material or a combination thereof, but is not limited thereto.

In some embodiments, the light-emitting diode 120A, the light-emitting diode 120B and/or the light-emitting diode 120C may have a surface $S_1$ opposite to the surface $S_2$, respectively. The surface $S_1$ is, for example, disposed adjacent to the transparent substrate 110. The surface $S_2$ is, for example, disposed away from the transparent substrate 110.

Refer to FIG. 2, which illustrates a cross-sectional view of a light-emitting diode package 10B in accordance with some embodiments of the present disclosure. The light-emitting diode package 10B is similar to the light-emitting diode package 10A. One of the differences is that the transparent substrate 110 may be an epitaxial substrate for disposing or forming the light-emitting diode 120A. In some embodiments, the light-emitting diode 120A emits, for example, blue light, and the substrate for disposing or forming the light-emitting diode 120A includes, for example, a sapphire substrate, a gallium phosphide (GaP) substrate, other suitable substrates or a combination of thereof, but is not limited thereto. In the embodiment as described above, the light-emitting diode 120A and the substrate (here, as the transparent substrate 110), for example, are not separated by a cutting process, so that an adhesive layer may not need to be disposed between the light-emitting diode 120A and the substrate (here, as the transparent substrate 110), but it is not limited thereto. In addition, in this embodiment, a plurality of light emitting diodes 120B (for example, emitting green light) may, for example, be disposed on the epitaxial substrate first. The plurality of light-emitting diodes 120B may, for example, be separated from each other by a cutting process, and the epitaxial substrate may be separated from each other into a plurality of epitaxial substrate portions by cutting. The plurality of epitaxial substrate portions may correspond to, for example, one light-emitting diode 120B, respectively, but are not limited thereto. Subsequently, the epitaxial substrate portions of the plurality of light-emitting diodes 120B may, for example, optionally be completely removed or partially removed such as by laser, grinding, or other suitable methods, but are not limited thereto. Likewise, the light-emitting diode 120C (for example, emitting red light) may be similar to the light-emitting diode 120B. A plurality of light-emitting diodes 120C may, for example, be disposed on the epitaxial substrate first. The plurality of light-emitting diodes 120C may, for example, be separated by a cutting process, and the epitaxial substrate may be separated from each other into a plurality of epitaxial substrate portions by cutting. The plurality of epitaxial substrate portions may correspond to, for example, one light-emitting diode 120C, respectively, but are not limited thereto. Subsequently, the epitaxial substrate portions of the plurality of light-emitting diodes 120C may, for example, optionally be completely removed or partially removed (as described above), but are not limited thereto.

As described above, there is an adhesive layer 130 disposed between the light-emitting diode 120B (and/or the light-emitting diode 120C) and the transparent substrate 110, and the light-emitting diode 120B (and/or the light-emitting diode) sticks to the transparent substrate 110 through the adhesive layer 130, but is not limited thereto.

Refer to FIG. 3, which illustrates a cross-sectional view of a light-emitting diode package 10C in accordance with some embodiments of the present disclosure. The light-emitting diode package 10C is similar to the light emitting diode package 10A. One of the differences is that the transparent substrate 110 can be an epitaxial substrate for forming the light-emitting diode 120B (for example, emitting green light). As described above, the transparent substrate 110 may include a sapphire substrate, a gallium phosphide (GaP) substrate, other suitable substrates, or a combination of the above substrates, but is not limited thereto. In this embodiment, the light-emitting diode 120B and the transparent substrate 110 are not separated by a cutting process, so that the adhesive layer 130 may not need to be disposed between the light-emitting diode 120B and the transparent substrate 110, but is not limited thereto. In this embodiment, the light-emitting diode 120A (for example, emitting blue light) and the light-emitting diode 120C (for example, emitting red light) may be, for example, similar to FIG. 2. The light-emitting diode 120A and/or the light-emitting diode 120C and the epitaxial substrate have been cut into a plurality of epitaxial substrate portions that are separated from each other, and there is, for example, an adhesive layer 130 disposed between the light-emitting diode 120A and/or the light-emitting diode 120C and the transparent substrate 110. The light emitting diode 120A and the light emitting diode 120C are stuck to the transparent substrate 110 through the adhesive layer 130, but it is not limited thereto.

Refer to FIG. 4, which illustrates a cross-sectional view of a light-emitting diode package 10D in accordance with some embodiments of the present disclosure. The light-emitting diode package 10D is similar to the light-emitting diode package 10A. One of the differences is that the light-emitting diode package 10D further includes an anti-reflection layer 140. The anti-reflection layer 140 may, for example, be disposed between the transparent substrate 110 and the adhesive layer 130, but it is not limited thereto. In other embodiments (not shown), the anti-reflective layer 140 can be disposed, for example, on the surface $S_3$ of the transparent substrate 110 away from the light-emitting diodes (120A, 120B, and/or 120C). In some embodiments, the refractive index of the anti-reflection layer 140 may be between 1.35 and 1.55 (1.35≤refractive index≤1.55), or the refractive index may be between 1.60 and 2.20 (1.6≤refractive index≤2.2), but is not limited thereto. In some embodiments, the anti-reflection layer 140 may include, for example, a single layer structure, a multilayer, or a composite layer structure. For example, the anti-reflection layer 140 may include, for example, a multilayer structure which includes a low refractive index layer and/or a high refractive index layer stacked, but is not limited thereto. In some embodiments, the anti-reflection layer 140 may be formed by a physical vapor deposition (PVD) process, a chemical vapor deposition (CVD) process or other processes. The anti-reflection layer 140 may be used to increase the transmittance of the light-emitting diode package 10D or to reduce the amount of external light that irradiates the light-emitting diode package 10D and thereby is reflected.

Refer to FIG. 5, which illustrates a cross-sectional view of a light-emitting diode package 10E in accordance with some embodiments of the present disclosure. The light-emitting diode package 10E is similar to the light-emitting diode package 10A. One of the differences is that the light-emitting diode package 10E includes at least one light shielding layer 150 and/or at least one protection layer 160, wherein the light shielding layer 150 is, for example, disposed between the transparent substrate 110 and the protection layer 160, but is not limited thereto. In some embodiments (FIG. 5), the light shielding layer 150 and/or the protection layer 160 are, for example, disposed adjacent to the adhesive layer 130. In some embodiments, the light shielding layer 150 and/or the protection layer 160, for example, surround the light-emitting diode 120A, the light-emitting diode 120B and/or the light-emitting diode 120C. In some embodiments, the light shielding layer 150 and/or the protection layer 160 is, for example, in contact with a portion of the light-emitting diode 120A, the light-emitting diode 120B and/or the light-emitting diode 120C. In some embodiments (not shown), the locations of the light shielding layer 150 and the protection layer 160 may be interchanged. In some embodiments, the light shielding layer 150 and/or the protection layer 160 can be optionally disposed or removed. In some embodiments (not shown), the protection layer 160 may, for example, be adjacent to (or surround) the light-emitting diodes 120A, 120B and/or 120C, and the light shielding layer 150 may, for example, surround the protection layer 160. In other words, in the normal line direction Z of the transparent substrate 110, the light-emitting diode 120A, the light-emitting diode 120B and/or the light-emitting diode 120C are, for example, sequentially surrounded by the protection layer 160 and the light shielding layer 150, but not limited thereto. Conversely, in some embodiments (not shown), the light shielding layer 150, for example, may be adjacent to (or surround) the light-emitting diode 120A, the light-emitting diode 120B and/or the light-emitting diode 120C, and the protection layer 160 may, for example, surround the light shielding layer 150. In other words, in the normal line direction Z of the transparent substrate 110, the light-emitting diode 120A, the light-emitting diode 120B, and/or the light-emitting diode 120C are, for example, sequentially surrounded by the light shielding layer 150 and the protection layer 160, but not limited thereto.

In some embodiments, the light shielding layer 150 may be formed by a physical vapor deposition process, a chemical vapor deposition process, or other processes, but it is not limited thereto.

In some embodiments, the light shielding layer 150 may include an absorbing material or a reflective material. In some embodiments, the light shielding layer 150 may include a black photoresist, a black printing ink, a black resin, a white ink, a composite material (e.g., a composite material that is surrounded by the reflective material or the absorbing material), another suitable material, or a combination thereof, but is not limited thereto. In some embodiments, the material of the light shielding layer 150 may include a metal, a metal alloy, a metal oxide, another suitable material, or a combination thereof, but is not limited thereto. The light shielding layer 150 may be used, for example, to absorb or shield ambient light, thereby reducing the impact on the quality of the electronic device caused by the ambient light when the ambient light passes the light-emitting diode package 10E and gets reflected. In addition, the light shielding layer 150 is used, for example, to increase the dark state of the non-light-emitting region, thereby raising the contrast of the electronic device. The non-light-emitting region is, for example, a region where there is no need to emit light or display an image. Alternatively, the light shielding layer 150 can be used, for example, to reduce the interference of the lights emitted by adjacent light-emitting diodes with each other.

In some embodiments, the protection layer 160 may include an organic insulating material, an inorganic insulating material, another suitable material or a combination thereof, but is not limited thereto. In some embodiments, the protection layer 160 may include a water-oxygen blocking characteristic, a buffer characteristic, but is not limited thereto. In some embodiments, the protection layer 160 may include a photoresist, an optical glue, a polymer, another suitable material or a combination thereof, but is not limited thereto. The life of the light-emitting diode can be increased by disposing the protection layer 160.

In some embodiments (not shown), the transparent substrate 110 may have a surface $S_3$. The surface $S_3$ is the surface of the transparent substrate 110 away from the light-emitting diode 120A, the light-emitting diode 120B, and/or the light-emitting diode 120C. The surface $S_3$ may be, for example, a rough surface (i.e., the surface $S_3$ has, for example, a plurality of grooves), thereby reducing ambient light irradiating the surface $S_3$ and being reflected.

Refer to FIG. 6, which illustrates a cross-sectional view of a light-emitting diode package 10F in accordance with some embodiments of the present disclosure. The light-emitting diode package 10F is similar to the light-emitting diode package 10A. One of the differences is that the light-emitting diode package 10F further includes an epitaxial substrate 126A and/or an epitaxial substrate 126B. In some embodiments, the epitaxial substrate 126A and the epitaxial substrate 126B are, for example, used as an epitaxial substrate for disposing or forming the light-emitting diode 120A and the light-emitting diode 120B, respectively, but are not limited thereto.

In some embodiments (FIG. 6), the multiple quantum well structure 122A has, for example, a thickness $T_1$, a multiple quantum well structure 122B has, for example, a thickness $T_2$, and a multiple quantum well structure 122C has, for example, a thickness $T_3$. The thickness $T_1$, the thickness $T_2$ and the thickness $T_3$ may be defined as the maximum thickness in the normal line direction Z of the transparent substrate 110 in any cross-section. It should be noted that the thickness of the aforementioned or subsequent structures, layers or elements can be measured, for example, by a scanning electron microscope (SEM). For example, the thickness may be obtained by taking an SEM image of a cross-section of the structure, layer or element and measuring the maximum thickness of the structure, layer or component measured as defined above in the SEM image, or it can be measured by other suitable measurement methods, but is not limited thereto. For example, a layer A (the object to be measured) is located between a layer B and a layer C, and as a result, the SEM image, for example, needs to show the layer A, at least a portion of the layer B and at least a portion of the layer C, and the thickness of the layer A is obtained by measuring the maximum thickness of the layer A in the SEM image, but is not limited thereto.

In some embodiments, the thickness $T_1$, the thickness $T_2$ and/or the thickness $T_3$ may be the same or different from each other. In some embodiments (such as FIG. 6), the thickness $T_3$ may be, for example, greater than the thickness $T_2$ (and/or thickness $T_1$). In some embodiments (such as FIG. 6), the thickness of the epitaxial substrate 126A and the epitaxial substrate 126B may be the same or different. The thickness design of the epitaxial substrate 126A (or the epitaxial substrate 126B) described above can be adjusted according to the thickness difference between the multiple quantum well structure 122A (or multiple quantum well structure 122B) and the multiple quantum well structures of other light-emitting diodes. The epitaxial substrate 126A (or the epitaxial substrate 126B) can be used, for example, as a compensation layer for a thickness to reduce the thickness difference between different multiple quantum well structures, but is not limited thereto. To be specific, in different light-emitting diodes, the thicknesses of the light-emitting layer (not shown), the semiconductor layer (not shown), or other layers in different multiple quantum well structures may vary, so the epitaxial substrate 126A (or the epitaxial substrate 126B) is used to reduce the thickness difference between different multiple quantum well structures. The respective conductive pads 124 of the light-emitting diode 120A, the light-emitting diode 120B and/or the light-emitting diode 120C in the light emitting diode package 10A are substantially on the same plane (i.e., substantially level with the plane of the second direction X—the first direction Y), thereby increasing the yield of disposing the light-emitting diode package 10A on the circuit substrate 210 (referring to FIG. 9).

In some embodiments (such as FIG. 6), the light-emitting diode package 10F may further include a thickness adjustment layer 170. The thickness adjustment layer 170 is, for example, disposed between the multiple quantum well structure 122C and the adhesive layer 130. In some embodiments, since the epitaxial substrate of the light-emitting diode 120C (emitting red light) may include an opaque material (for example, gallium arsenide GaAs, but is not limited thereto), the light-emitting diode 120C does not used, for example the epitaxial substrate as a compensation layer for the aforementioned thickness. In some embodiments, the light-emitting diode 120C is further provided with a thickness adjustment layer 170 to compensate for the thickness differences with multiple quantum well structures (including light-emitting layers, semiconductor layers or other layers) in other light-emitting diodes, or reduce the thickness difference with different multiple quantum well structures. In some embodiments, the thickness adjustment layer 170 may include a transparent material. In some embodiments, the thickness adjustment layer 170 may include glass, plastic, ceramic, polymer (including epoxy resin), sapphire, inorganic insulating layer, organic insulating layer, another suitable material, or a combination thereof, but is not limited thereto.

Refer to FIG. 7, which illustrates a top view of a light-emitting unit in accordance with some embodiments of the present disclosure. In some embodiments, the light-emitting unit U1 includes, for example, a light-emitting diode 120A, a light-emitting diode 120B, and a light-emitting diode 120C, but is not limited thereto. The light-emitting diode 120A, the light-emitting diode 120B, and the light-emitting diode 120C in the light-emitting unit U1 may be arranged, for example, in the first direction Y. In some embodiments (such as FIG. 7), the light-emitting unit U2 includes, for example, two light-emitting diodes 120A, two light-emitting diodes 120B, and two light-emitting diodes 120C. The light-emitting diodes may be arranged, for example, in the first direction Y. For example, the two light-emitting diodes 120A in the light-emitting unit U2 are spaced apart by the light-emitting diodes 120B and the light-emitting diodes 120C, and the six light-emitting diodes are arranged in the first direction Y, but are not limited thereto. In some embodiments, the light emitting unit U3 includes, for example, two light-emitting diodes 120A, two light-emitting diodes 120B, and two light-emitting diodes 120C. The light-emitting diodes in the light-emitting unit U3 can be set, for example, as a 2×3 array, but not limited thereto. In other embodiments, the light-emitting diodes in the light-emitting unit can be, for example, an m×m array, where m is greater than two. In other embodiments, the light emitting unit can be an m×n array, where m and n are greater than or equal to two, m and n are positive integers, and m≠n other embodiments, the outlines of the light-emitting units in the normal line direction Z of the transparent substrate 110 (i.e., in the direction of the electronic device in a top view) are, for example, a rectangle, a diamond, a polygon, an arc, other suitable shapes, or a combination thereof, but not limited thereto. In some embodiments (not shown), the number of the light emitting diode 120A, the light emitting diode 120B, and/or the light emitting diode 120C respectively included in the light-emitting unit U2 may be the same or different. For example, the light-emitting unit U2 may include two light-emitting diodes 120A, one light-emitting diode 120B, and one light-emitting diode 120C, but is not limited thereto.

Refer to FIG. 8, which illustrates a top view of a light-emitting unit in accordance with some embodiments of the present disclosure. In some embodiments (such as FIG. 8), the light-emitting diodes 120A, the light-emitting diodes 120B, and the light-emitting diodes 120C of the light-emitting unit U4 are not arranged, for example, in the same direction. For example, the light-emitting diodes 120A and the light-emitting diodes 120B of the light-emitting unit U4 may be alternately arranged in the second direction X, and the light-emitting diodes 120C are, for example, disposed adjacent to the light-emitting diodes 120A and the light-emitting diodes 120B. However, it is disposed in a different row from that of the light-emitting diode 120A and the light-emitting diode 120B, and the light-emitting diode 120C and the light-emitting diode 120A and the light-emitting diode 120B are, for example, are disposed in a misalignment fashion, but are not limited thereto. In other words, in some embodiments (such as FIG. 8), the light-emitting diode 120C is not aligned with the light-emitting diode 120A and/or the light-emitting diode 120B in the first direction Y. The aforementioned second direction X is different from the first direction Y. In some embodiments, the angle between the second direction X and the first direction Y may be, for example, between 45° and 90° (45°≤angle≤90°). In some embodiments (such as FIG. 8), the connecting line among the centers of the light-emitting diode 120C, the light-emitting diode 120A and the light-emitting diode 120B may be, for example, a triangle, but is not limited thereto.

In other embodiments, the arrangement of the light-emitting diodes in the light-emitting unit can be adjusted according to needs.

In some embodiments, the light-emitting diode packages 10A to 10F as described above may include at least one light-emitting unit, for example, including the light-emitting unit U1, the light-emitting unit U2, the light-emitting unit U3, the light-emitting unit U4, and light-emitting units that have other light-emitting diode arrangements or a combination thereof, but is not limited thereto.

Refer to FIG. 9, which illustrates a cross-sectional view of the electronic device 20A in accordance with some embodiments of the present disclosure. It should be noted that some elements are omitted in the electronic device 20A and the electronic devices shown in other embodiments for the sake of brevity, that additional elements may be added to the electronic device 20A of some embodiments of the present disclosure, and that as described in some embodiments below. Elements can be optionally replaced or omitted.

In some embodiments, the electronic device 20A may include the circuit substrate 210 and at least one light-emitting diode package 10A disposed on the circuit substrate 210. The circuit substrate 210 may contain various electronic elements or circuits according to the use of the electronic device 20A, for example, including a thin film transistor (switching transistor, driving transistor, reset transistor, or other thin film transistors), capacitor, but is not limited thereto.

In some embodiments, the circuit substrate 210 may include a rigid substrate, a flexible substrate or a combination thereof. The material of the circuit substrate 210 may include glass, sapphire, ceramic, quartz, plastic, silicon material, other suitable substrates or a combination thereof, but is not limited thereto. In some embodiments, the material of the plastic substrate may include polyimine (PI), polyethylene terephthalate (PET), polycarbonate (PC), polyether oxime (PES), polybutylene terephthalate (PBT), polynaphthalene Ethylene glycolate (PEN), polyarylate (PAR), another suitable material or a combination thereof, but is not limited thereto.

In some embodiments (not shown), the aforementioned electronic device of the present disclosure may further include a liquid crystal layer, a light guide plate, a reflection layer, a diffusion plate and/or other elements, but is not limited thereto. At this time, the light-emitting diode package of the present disclosure can be used as a light source of the backlight module.

Figure 10:
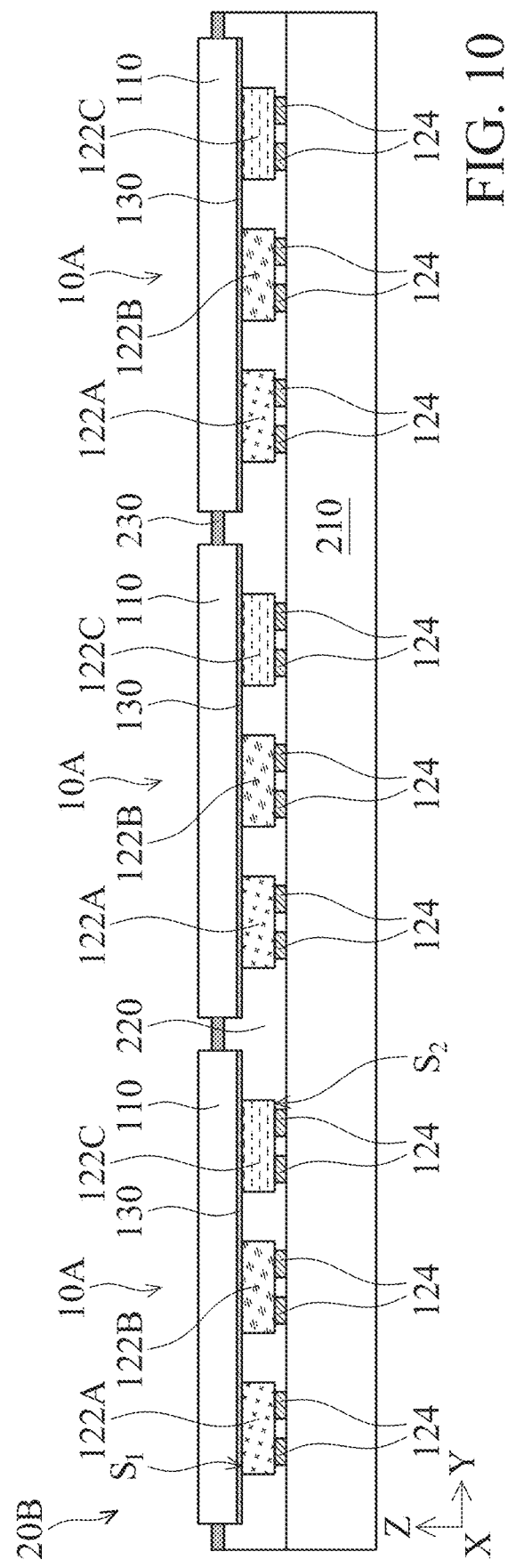
FIG. 10 illustrates a cross-sectional view of an electronic device in accordance with some embodiments of the present disclosure.

Refer to FIG. 10, which illustrates a cross-sectional view of an electronic device 20B in accordance with some embodiments of the present disclosure. The electronic device 20B is similar to the electronic device 20A. One of the differences is that the electronic device 20B may further include a protection layer 220 and/or a light shielding layer 230. In some embodiments, the protection layer 220 is, for example, disposed between the circuit substrate 210 and the transparent substrate 110. In some embodiments, the protection layer 220, for example, is adjacent to or surrounds the light-emitting diode package 10A. The material or function of the protection layer 220 is the same as those of the protection layer 160 described above, which will not be repeated herein.

In some embodiments (such as FIG. 10), the light shielding layer 230 is, for example, disposed on the protection layer 220 and the light shielding layer 230 is patterned, for example. In other words, the light shielding layer 230 has, for example, a plurality of openings and the plurality of openings of the light shielding layer 230, for example, substantially overlap with the light-emitting diode package 10A in the normal line direction Z of the transparent substrate 110. The material, function or arrangement of the light shielding layer 230 is the same as those of the light shielding layer 150 described, which will not be repeated herein.

In addition, the aforementioned electronic device 20A or electronic device 20B may optionally include an anti-reflection layer (not shown, referring to the anti-reflection layer 140 described above), which will not be repeated herein.

Refer to FIGS. 11A-11E, which illustrate cross-sectional views of a method of manufacturing an electronic device 20C at various stages in accordance with some embodiments of the present disclosure. It should be noted that additional steps may be added according to needs in some embodiments of the disclosure, and that the steps as described in some embodiments below may be optionally replaced or omitted.

Figure 11A:
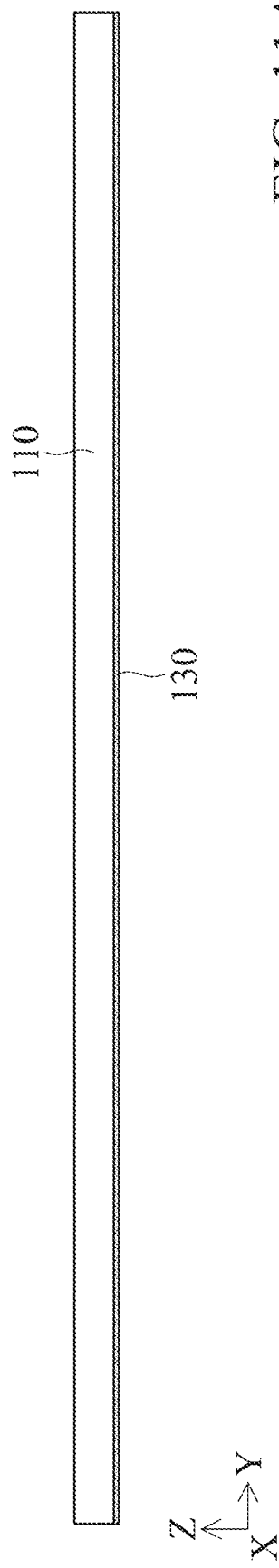
FIGS. 11A-11E illustrate cross-sectional views of manufacturing an electronic device at various stages in accordance with some embodiments of the present disclosure.

As shown in FIG. 11A, a transparent substrate 110 is provided, and the adhesive layer 130 is disposed or coated on the transparent substrate 110. In some embodiments, the adhesive layer 130 may be disposed or coated, for example, continuously or discontinuously on the transparent substrate 110. In some embodiments, the adhesive layer 130 may be disposed, for example, on at least a portion of the transparent substrate 110. In some embodiments, the adhesive layer 130 may have, for example, a pattern.

Figure 11B:
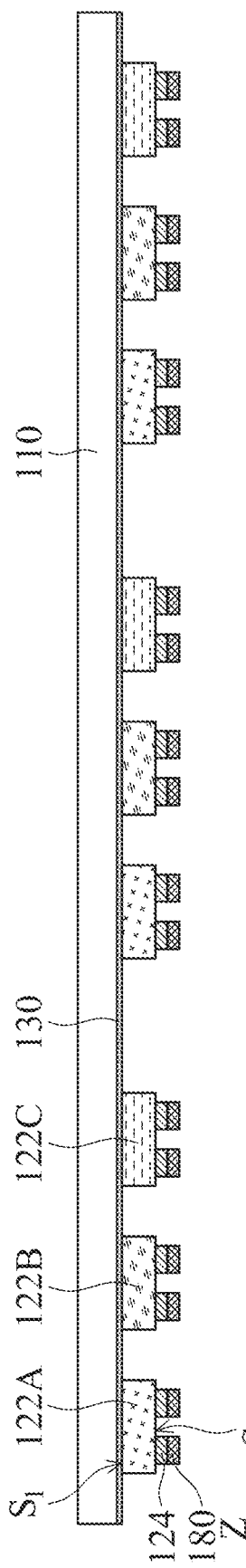

Next, as shown in FIG. 11B, a plurality of light-emitting diodes 120A, light-emitting diodes 120B, and light-emitting diodes 120C are disposed on the transparent substrate 110, and a plurality of light-emitting diodes are fixed on the transparent substrate 110 via the adhesive layer 130. In addition, the light-emitting diode 120A, the light-emitting diode 120B, and the light-emitting diode 120C include two conductive pads 124, respectively. The conductive pads 124 are, for example, located on the surface $S_2$ of the light-emitting diode. Subsequently, the plurality of solder layers 180 are respectively disposed corresponding to the conductive pads 124, and the plurality of solder layers 180 are, for example, electrically connected to the corresponding conductive pads 124, respectively. In some embodiments, the material of the solder layer 180 may include tin (Sn), gold (Au), copper (Cu), indium (In), other suitable conductive materials or a combination thereof, but is not limited thereto. In some embodiments, the conductive pads 124 and/or the solder layer 180 may be formed by thermal evaporation, electroplating, chemical plating or other suitable methods, but are not limited thereto.

Figure 11C:
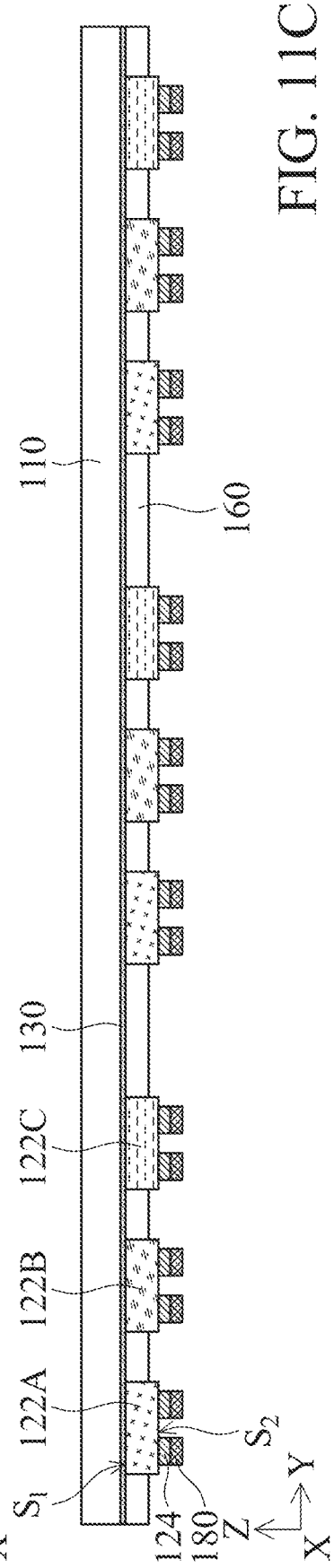

As shown in FIG. 11C, at least one protection layer 160 is disposed on the adhesive layer 130, and the protection layer 160 may be adjacent to or surround the plurality of light-emitting diodes 120A, the light-emitting diodes 120B and the light-emitting diodes 120C, for example. In some embodiments, the protection layer 160 may be formed by a chemical vapor deposition (CVD) process, a physical vapor deposition (PVD) process, other suitable processes or a combination thereof, but is not limited thereto.

Figure 11D:
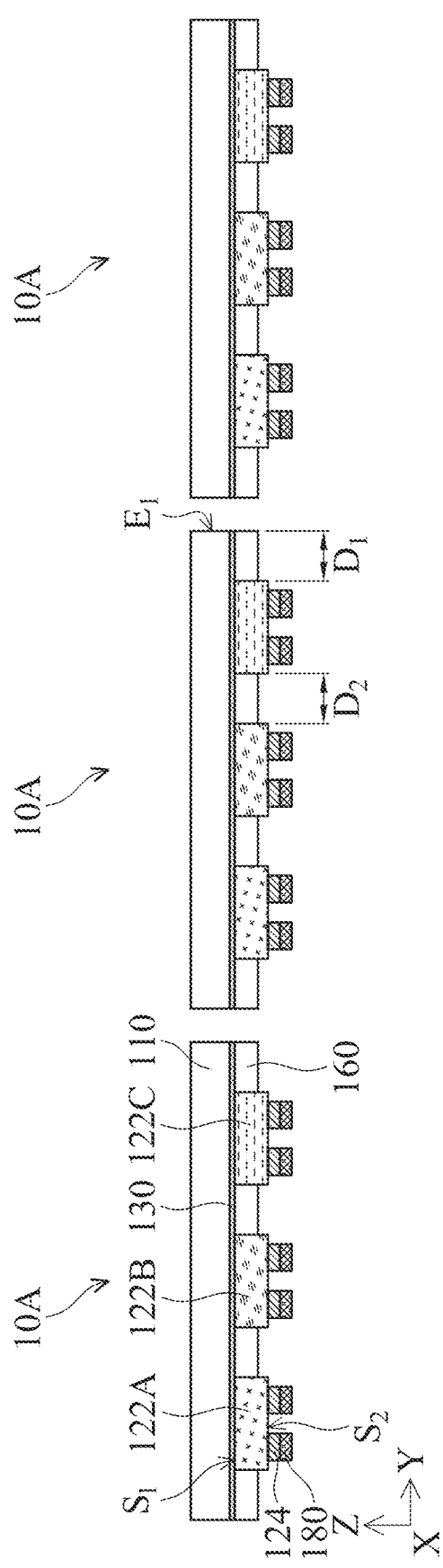

Next, as shown in FIG. 11D, a cutting process is performed on the transparent substrate 110 to form a plurality of light-emitting diode packages 10A which are separated from each other. In some embodiments (FIG. 11D), a portion of the transparent substrate 110 in the cut light-emitting diode package 10A may have, for example, an edge $E_1$, wherein the distance $D_1$ between the light-emitting diode the edge $E_1$ is, for example, less than or equal to the distance $D_2$ between two adjacent light-emitting diodes, but is not limited thereto. The distance $D_1$ is, for example, the minimum distance between one of the light-emitting diodes closest to the edge $E_1$ and the edge $E_1$ in the first direction y, and the distance $D_2$ is, for example, the minimum distance between two adjacent light-emitting diodes in the first direction Y. In other embodiments, the relationship between distance $D_1$ and distance $D_2$ can be adjusted according to needs.

Figure 11E:
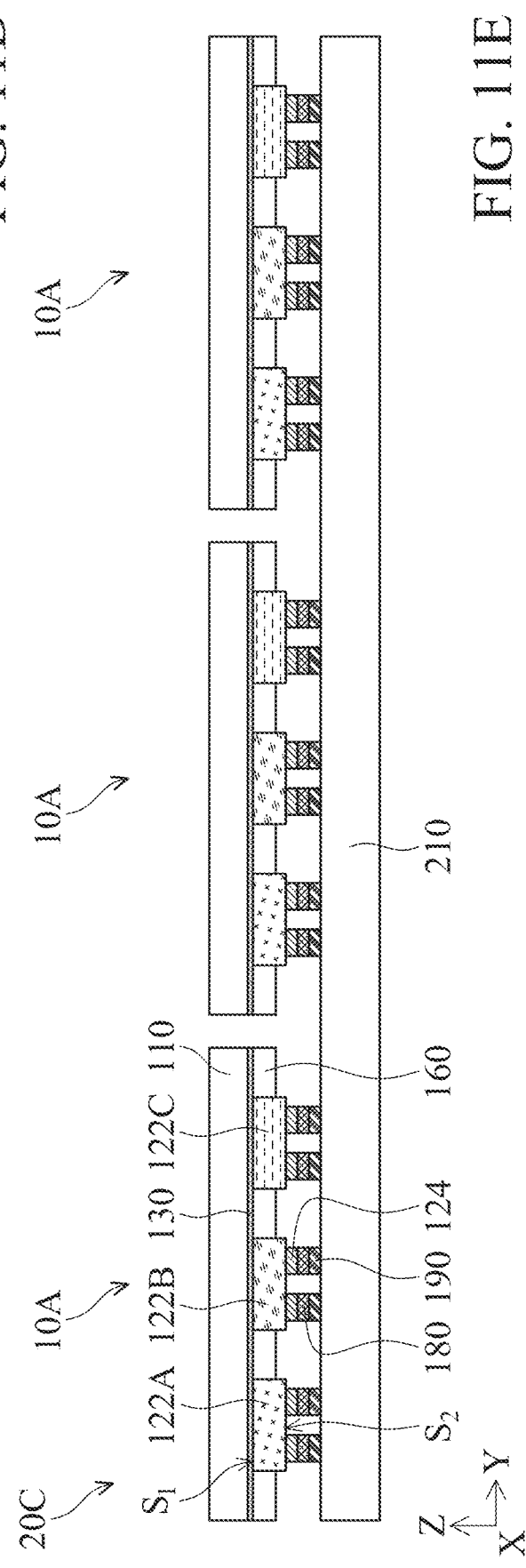

Next, as shown in FIG. 11E, the solder layers 180 are respectively aligned with the conductive pads 190 on the circuit substrate 210 (i.e., substantially aligned or overlapped in the normal direction Z of the transparent substrate 110), and at least one light-emitting diode package 10A is disposed or fixed on the circuit substrate 210 by soldering (e.g., including reflow or hot pressing) or other suitable processes to form the electronic device 20C. The material of the conductive pad 190 may include a metal (e.g., gold, nickel, copper, and silver or other suitable metals) or another suitable material, but is not limited thereto. In this embodiment, the transparent substrate 110 is disposed adjacent to the surface $S_1$ of the light-emitting diode 120A, the light emitting diode 120B, and/or the light emitting diode 120C, and is disposed away from the circuit substrate 210. It should be explained that, in the electronic device 20C (such as FIG. 11E), the multiple quantum well structure 122A in the light-emitting diode 120A may be disposed between the transparent substrate 110 and the conductive pads 124 of the light-emitting diode 120A, that the multiple quantum well structure 122B in the light-emitting diode 120B may be disposed between the transparent substrate 110 and the conductive pads 124 of the light-emitting diode 120B, and that the multiple quantum well structure 122C in the light-emitting diode 120C may be disposed between the transparent substrate 110 and the conductive pads 124 of the light-emitting diode 120B.

Refer to FIGS. 12A to 12D, which illustrate cross-sectional views of a method of manufacturing an electronic device 20D at various stages in accordance with some embodiments of the present disclosure. It should be noted that additional steps may be added to some embodiments of the present disclosure, and that the steps as described in some embodiments below may be optionally replaced or omitted. In some embodiments (FIG. 12A), the light-emitting diodes 120A, the light-emitting diodes 120B and the light-emitting diodes 120C may, for example, be disposed on the transparent substrate 110. The surfaces $S_2$ of the light-emitting diodes 120A, the light-emitting diodes 120B and the light-emitting diodes 120C may be disposed adjacent to the transparent substrate 110, and the light emitting diode 120A is disposed, for example, on the transparent substrate 110. The light emitting diode 120B is disposed, for example, on the transparent substrate 110. The conductive pads 124 of the light-emitting diode 120C is disposed, for example, between the transparent substrate 110 and the multiple quantum well structures 122A, 122B, and/or 122C. In some embodiments (FIG. 12A), the soldering material layer 240 may be disposed, for example, on the transparent substrate 110 and between the light-emitting diodes 120A, the light-emitting diodes 120B and the light-emitting diodes 120C. The conductive pads of the light-emitting diodes 120A, the light-emitting diodes 120B and the light-emitting diodes 120C may be soldered (for example, including reflow or hot pressing) to the transparent substrate 110 via the soldering material layer 240, respectively, but are not limited thereto.

In some embodiments (FIG. 12A), the transparent substrate 110 includes a plurality of openings O and a plurality of conductive elements 250 respectively located in the openings O. To be specific, in some embodiments (FIG. 12A), the plurality of openings O (i.e., via holes) may be formed in the transparent substrate 110 by a lithography process and/or an etching process, and the conductive element 250 is located, for example, in the opening O, and a portion of the conductive element 250 is, for example, further in contact with elements of the lower surface DS of the transparent substrate 110. In some embodiments, the soldering material layer 240 is heated and fills the openings O to form the conductive elements 250, but is not limited thereto. In some embodiments, the material of conductive element 250 is, for example, the same as or different from that of the soldering material layer 240. In some embodiments, the conductive element 250 is used, for example, to connect the light-emitting diode to an element (e.g., the circuit substrate 210) adjacent to the lower surface DS of the transparent substrate 110, which will be described in detail later. The conductive element 250 may include a metal, an alloy, a transparent conductive material, another suitable material or a combination thereof, but is not limited thereto.

Figure 12A:
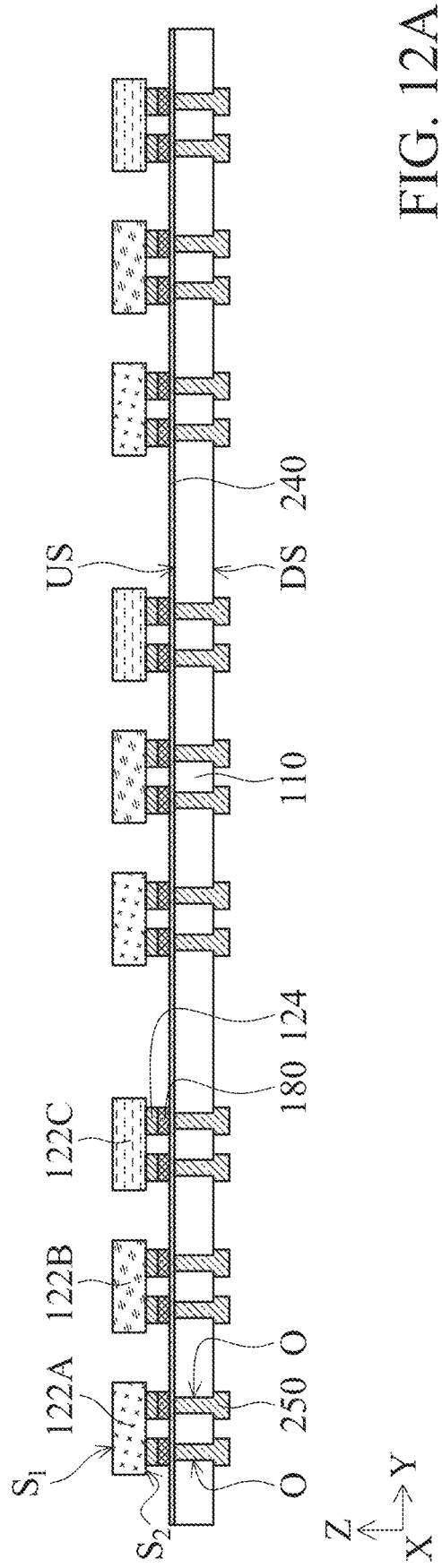
Figure 12B:
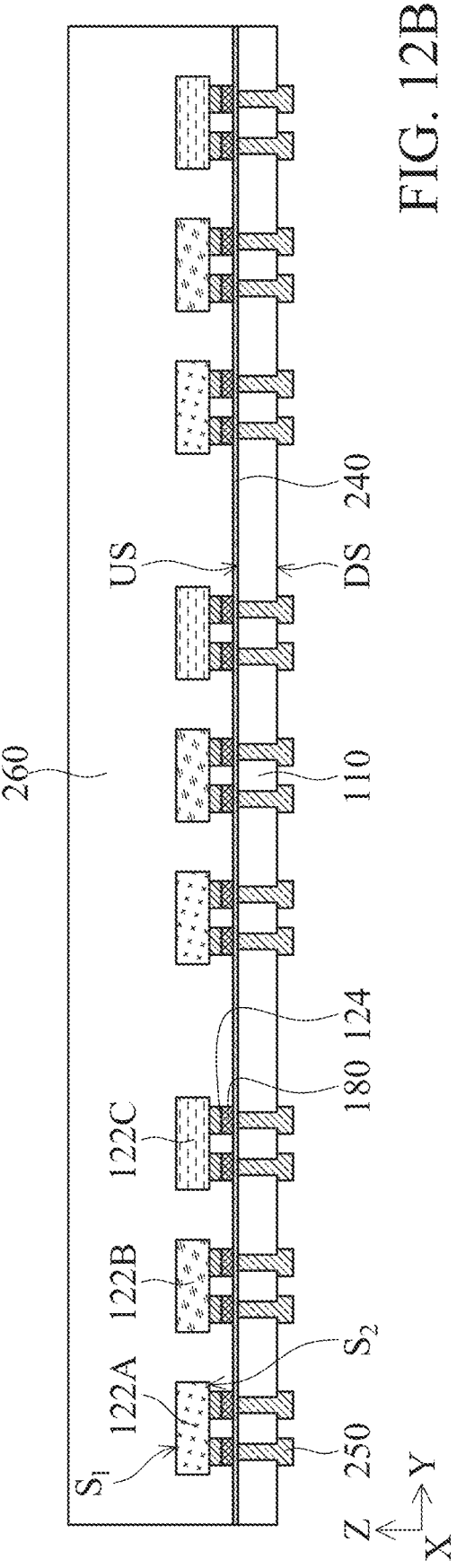

Next, as shown in FIG. 12B, a protection layer 260 is disposed or formed on the transparent substrate 110. The protection layer 260 covers the light-emitting diode 120A, the light-emitting diode 120B and/or the light-emitting diode 120C. In some embodiments, the protection layer 260 may include an organic insulating layer, an inorganic insulating layer, another suitable material or a combination thereof. In some embodiments, the protection layer 260 may include a water-oxygen blocking characteristic, a buffering characteristic, but is not limited thereto. In some embodiments, the protection layer 260 includes, for example, a photoresist, an adhesive material (e.g., a thermocurable epoxy resin or a photocurable adhesive material), another suitable material or a combination thereof, but is not limited thereto. In some embodiments (not shown), the protection layer 260 may have an arc edge or an irregularly-shaped edge.

Next, as shown in FIG. 12C, a cutting process is performed on the transparent substrate 110 and the protection layer 260 to form a plurality of light-emitting units U5 separated from each other. Subsequently, a circuit substrate 210 is provided and a conductive pad 212 and/or a solder layer 214, for example, are disposed on the circuit substrate 210. In some embodiments, the conductive pad 212 is disposed between the circuit substrate 210 and the solder layer 214, but is not limited thereto. In some embodiments, the conductive pad 212 may include a metal material, such as copper (Cu), nickel (Ni), gold (Au), titanium (Ti), aluminum (Al), chromium (Cr), palladium (Pt), silver. (Ag), aluminum (Al), other metal materials, an alloy thereof or a combination thereof, but is not limited thereto. The solder layer 214 may include tin (Sn), indium (In), gold (Au), copper (Cu), silver (Ag), another suitable material or a combination thereof, but is not limited thereto.

As shown in FIG. 12D, the light-emitting diodes (e.g., 120A, 120B, and 120C) on the transparent substrate 110 may be electrically connected to the circuit substrate 210 through the soldering material layer 240, the conductive element 250, the solder layer 214, and/or the conductive pad 212 by a heat melting process or other processes to form the electronic device 20D.

Figure 13:
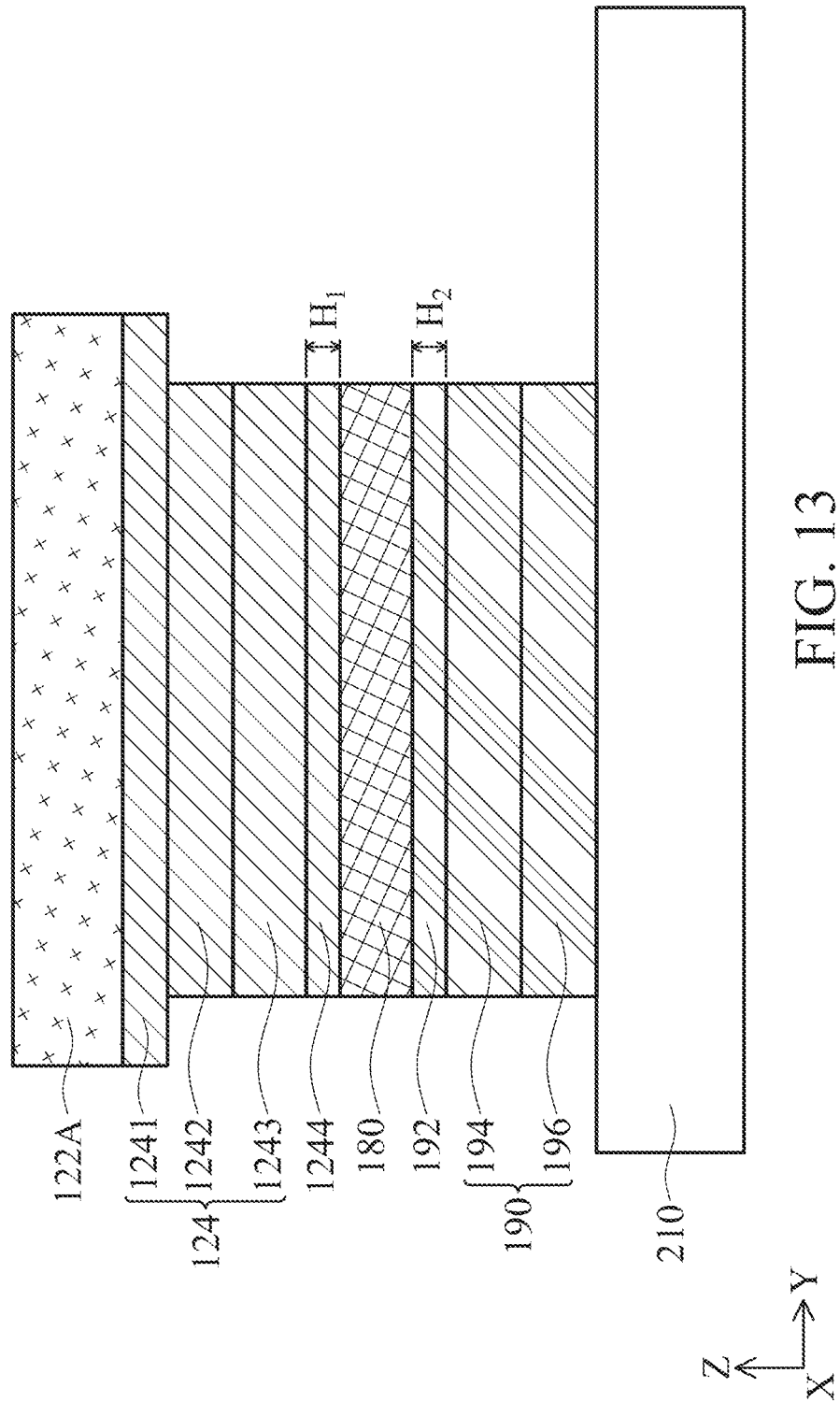
FIG. 13 illustrates an enlarged cross-sectional view of a conductive pad of an electronic device in accordance with some embodiments of the present disclosure.

Refer to FIG. 13, which illustrates a partially enlarged view of an electronic device in accordance with some embodiments of the present disclosure (referring to FIG.

11E) and is used to illustrate the detailed lamination of the conductive pad 124 and the conductive pad 190 of the aforementioned electronic device. As shown in FIG. 13, the conductive pad 124 may include a conductive layer 1241 (e.g., an ohmic contact layer), an attachment layer 1242 and a barrier layer 1243. The conductive layer 1241 may be disposed or formed, for example, on the multiple quantum well structure 122A of the light-emitting diode. In some embodiments, the conductive layer 1241 may include copper, aluminum, silver, titanium, molybdenum, another suitable material, or a combination thereof, but is not limited thereto. The attachment layer 1242 may be disposed on a side of the conductive layer 1241 that is away from the multiple quantum well structure 122A. In some embodiments, the attachment layer 1242 may include copper, aluminum, titanium, chromium, another suitable material, or a combination thereof, but is not limited thereto. The barrier layer 1243 is disposed on the attachment layer 1242. In some embodiments, the barrier layer 1243 may include nickel, platinum, palladium, gold, molybdenum, tungsten, titanium, another suitable material, an alloy thereof or a combination thereof, but is not limited thereto. In some embodiments, during the bonding of the solder layer 180 to the conductive pads 124 via a heat melting process, a metal composite layer 1244, for example, may be generated. The metal composite layer 1244 may be located between the solder layer 180 and the conductive pad 124, but is not limited thereto. The material of the metal composite layer 1244 may include the materials in the solder layer 180 and/or the materials in the conductive pad 124. In some embodiments, the boundary between the metal composite layer 1244 and the conductive pad 124 may not be apparent, or the boundary between the metal composite layer 1244 and the solder layer 180 may not be apparent.

As shown in FIG. 13, the conductive pad 190 may include a conductive layer 196 and a barrier layer 194 sequentially disposed on the circuit substrate 210. In some embodiments, the barrier layer 194 may include nickel, platinum, palladium, gold, molybdenum, tungsten, titanium, another suitable material, an alloy thereof or a combination thereof, but is not limited thereto. During the bonding of the solder layer 180 to the conductive pad 190 via a heat melting process, a metal composite layer 192, for example, may be generated. The metal composite layer 192 may be located between the solder layer 180 and the conductive pad 190, but is not limited thereto. The material of the metal composite layer 192 may include the materials in the solder layer 180 and/or the materials in the conductive pad 190. In some embodiments, the boundary between the metal composite layer 192 and the conductive pad 190 may not be apparent, or the boundary between the metal composite layer 192 and the solder layer 180 may not be apparent. In some embodiments, the metal composite layer 192 may include copper, aluminum, silver, titanium, molybdenum, another suitable material, an alloy thereof or a combination thereof, but is not limited thereto.

In some embodiments, metal composite layer 1244 may have a thickness H1, metal composite layer 192 may have a thickness H2, and the thickness H1 may be the same as or different from the thickness H2. For example, if the conductive pads 124 and the conductive pads 190 are heated for the same amount of time (for example, the above-described heating and melting), the thickness H1 may be, for example, substantially equal to the thickness H2. The thickness H1 and the thickness H2 may be defined as the maximum thickness of the metal composite layer 1244 and the metal composite layer 192, respectively, in the normal line direction Z of the transparent substrate 110 in any cross-section, and the thicknesses may be measured, for example, by a scanning electron microscope as described above.

In some embodiments, when the solder layer 180 is first disposed on the conductive pads 124 (e.g., the barrier layer 1243) by a heating process (e.g., thermal evaporation), it can combine the conductive pad 190 on the circuit substrate 210 through a heat melting process. At the time, the thickness H1 may be, for example, greater than the thickness H2, but is not limited thereto. In some embodiments, when the soldering material 180 is first disposed on the conductive pad 190 by a heating process (e.g., thermal evaporation) and then the conductive pad 190 and the soldering material 180 are combined with the conductive pads 124 through a heat melting process, the thickness H1 may be, for example, less than the thickness H2, but is not limited thereto.

Although the embodiments of the present disclosure and the advantages have been disclosed above, it should be understood that one of ordinary skill in the art can make changes, substitutions, and modification without departing from the spirit and scope of the present disclosure. In addition, the scope of the present disclosure is not limited to the process, machine, manufacture, compositions of matter, devices, methods and steps of particular embodiments described in the specification. Any one of ordinary skill in the art will readily appreciate from the disclosure of the present disclosure, processes, machines, manufacture, compositions of matter, devices, methods, or operations presently existing or later to be developed. As long as they can perform substantially the same functions or achieve substantially the same results in the embodiments described herein, they may be used according to the present disclosure. Accordingly, the scope of the present disclosure include such processes, machines, manufacture, compositions of matter, devices, methods, or steps. In addition, each claim constitutes an individual embodiment, and the scope of the present disclosure also includes a combination of the claims and the embodiments. The features of the various embodiments can be arbitrarily mixed and used as long as they do not contradict or conflict the spirit of the invention.

What is claimed is:

1. A light-emitting diode package, comprising:
    a transparent substrate;
    a first light-emitting diode disposed on the transparent substrate, wherein the first light-emitting diode has a first multiple quantum well structure; and
    a second light-emitting diode disposed on the transparent substrate, wherein the second light-emitting diode has a second multiple quantum well structure,
    wherein the first multiple quantum well structure and the second multiple quantum well structure are configured to emit lights with different wavelengths, wherein at least one of the first light-emitting diode and the second light-emitting diode sticks to the transparent substrate by using a transparent adhesive layer, and wherein a surface of the transparent substrate away from the first light-emitting diode and the second light-emitting diode has a rough surface.

2. The light-emitting diode package as claimed in claim 1, wherein the transparent substrate is an epitaxial substrate for forming the first light-emitting diode.

3. The light-emitting diode package as claimed in claim 1, further comprising:
    a thickness adjustment layer disposed between the transparent substrate and the second light-emitting diode.

4. The light-emitting diode package as claimed in claim 1, further comprising:

an epitaxial substrate used for forming the first light-emitting diode and disposed between the transparent substrate and the first light-emitting diode.

5. The light-emitting diode package as claimed in claim 4, wherein the first multiple quantum well structure emits a blue light or a green light.

6. The light-emitting diode package as claimed in claim 5, wherein the second multiple quantum well structure emits a red light.

7. The light-emitting diode package as claimed in claim 1, further comprising:
an anti-reflection layer disposed on the transparent substrate.

8. The light-emitting diode package as claimed in claim 1, further comprising:
an anti-reflection layer disposed between the transparent substrate and the first light-emitting diode and disposed between the transparent substrate and the second light-emitting diode.

9. The light-emitting diode package as claimed in claim 1, wherein the transparent substrate comprises a plurality of openings and a plurality of conductive elements in the plurality of openings, respectively.

10. An electronic device, comprising:
a circuit substrate; and
a light-emitting diode package disposed on the circuit substrate and comprising:
a transparent substrate;
a first light-emitting diode disposed on the transparent substrate, wherein the first light-emitting diode has a first multiple quantum well structure; and
a second light-emitting diode disposed on the transparent substrate, wherein the second light-emitting diode has a second multiple quantum well structure,
wherein the first multiple quantum well structure and the second multiple quantum well structure are configured to emit lights with different wavelengths, wherein at least one of the first light-emitting diode and the second light-emitting diode sticks to the transparent substrate by using a transparent adhesive layer, and wherein a surface of the transparent substrate away from the first light-emitting diode and the second light-emitting diode has a rough surface.

11. The electronic device as claimed in claim 10, wherein the transparent substrate is an epitaxial substrate for forming the first light-emitting diode.

12. The electronic device as claimed in claim 10, further comprising:
a thickness adjustment layer disposed between the transparent substrate and the second light-emitting diode.

13. The electronic device as claimed in claim 10, further comprising:
an epitaxial substrate used for forming the first light-emitting diode and disposed between the transparent substrate and the first light-emitting diode.

14. The electronic device as claimed in claim 13, wherein the first multiple quantum well structure emits a blue light or a green light.

15. The electronic device as claimed in claim 14, wherein the second multiple quantum well structure emits a red light.

16. The electronic device as claimed in claim 10, further comprising:
an anti-reflection layer disposed on the transparent substrate.

17. The electronic device as claimed in claim 10, further comprising:
an anti-reflection layer disposed between the transparent substrate and the first light-emitting diode and disposed between the transparent substrate and the second light-emitting diode.

18. The electronic device as claimed in claim 10, wherein the transparent substrate comprises a plurality of openings and a plurality of conductive elements in the plurality of openings, respectively.

* * * * *